(12) United States Patent
Ishizuka et al.

(10) Patent No.: US 9,065,422 B2
(45) Date of Patent: Jun. 23, 2015

(54) FREQUENCY STABILIZATION CIRCUIT, ANTENNA DEVICE, AND COMMUNICATION TERMINAL APPARATUS

(71) Applicant: Murata Manufacturing Co., Ltd., Nagaokakyo-shi, Kyoto-fu (JP)

(72) Inventors: Kenichi Ishizuka, Nagaokakyo (JP); Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 212 days.

(21) Appl. No.: 13/904,124

(22) Filed: May 29, 2013

(65) Prior Publication Data

US 2013/0249767 A1    Sep. 26, 2013

Related U.S. Application Data

(63) Continuation of application No. PCT/JP2012/050767, filed on Jan. 17, 2012.

(30) Foreign Application Priority Data

Jan. 20, 2011 (JP) .................. 2011-010120

(51) Int. Cl.
*H01Q 21/00* (2006.01)
*H03H 7/38* (2006.01)
(Continued)

(52) U.S. Cl.
CPC ............... *H03H 7/38* (2013.01); *H03H 7/0115* (2013.01); *H04B 1/0458* (2013.01); *H04B 1/18* (2013.01);
(Continued)

(58) Field of Classification Search
CPC ...... H01Q 21/0006; H01Q 21/30; H03H 7/38; H03H 7/0115; H03H 7/461; H03H 7/463; H03H 2001/0085; H04B 1/18; H04B 1/0458
USPC .......................................... 343/852, 853, 860
See application file for complete search history.

(56) References Cited

U.S. PATENT DOCUMENTS 6,229,493 B1    5/2001    Iijima
7,015,870 B2 *  3/2006    Guitton et al. ................ 343/860
(Continued)

FOREIGN PATENT DOCUMENTS

CN    101536309 A    9/2009
JP    2000-124728 A   4/2000
(Continued)

OTHER PUBLICATIONS

Official Communication issued in International Patent Application No. PCT/JP2012/050767, mailed on Apr. 24, 2012.
(Continued)

*Primary Examiner* — Hoanganh Le
(74) *Attorney, Agent, or Firm* — Keating & Bennett, LLP

(57) ABSTRACT

A frequency stabilization circuit includes a primary side circuit connected to a feeder circuit, and a secondary side circuit electromagnetically coupled to the primary side circuit. The primary side circuit is a series circuit including a first coiled conductor and a second coiled conductor, and the secondary side circuit is a series circuit including a third coiled conductor and a fourth coiled conductor. An antenna element is connected through a high pass filter to a first antenna connection portion set as a connection point of the first coiled conductor and the second coiled conductor. Additionally, the antenna element is connected through a low pass filter to a second antenna connection portion set as a connection point between the second coiled conductor and the fourth coiled conductor.

19 Claims, 12 Drawing Sheets

(51) Int. Cl.
- *H03H 7/01* (2006.01)
- *H04B 1/04* (2006.01)
- *H04B 1/18* (2006.01)
- *H01Q 21/30* (2006.01)
- *H03H 7/46* (2006.01)
- *H03H 1/00* (2006.01)

(52) U.S. Cl.
CPC ........... *H01Q 21/30* (2013.01); *H01Q 21/0006* (2013.01); *H03H 7/461* (2013.01); *H03H 7/463* (2013.01); *H03H 2001/0085* (2013.01)

(56) References Cited

U.S. PATENT DOCUMENTS

| | | | |
|---|---|---|---|
| 8,723,753 B2 * | 5/2014 | Kato et al. | 343/853 |
| 2010/0109967 A1 | 5/2010 | Ranta | |
| 2011/0309994 A1 * | 12/2011 | Kato et al. | 343/860 |
| 2012/0056795 A1 * | 3/2012 | Nagumo et al. | 343/787 |
| 2012/0086526 A1 | 4/2012 | Kato | |
| 2012/0112979 A1 * | 5/2012 | Kato et al. | 343/853 |

FOREIGN PATENT DOCUMENTS

| | | |
|---|---|---|
| JP | 2000-151248 A | 5/2000 |
| JP | 2000-244273 A | 9/2000 |
| JP | 2001-36328 A | 2/2001 |
| JP | 2002-280862 A | 9/2002 |
| JP | 2004-304615 A | 10/2004 |
| JP | 2008-35065 A | 2/2008 |
| WO | 2010/146944 A1 | 12/2010 |

OTHER PUBLICATIONS

Official Communication issued in corresponding Chinese Patent Application No. 201280005897.6, mailed on Jun. 4, 2014.

* cited by examiner

FREQUENCY STABILIZATION CIRCUIT, ANTENNA DEVICE, AND COMMUNICATION TERMINAL APPARATUS

BACKGROUND OF THE INVENTION

1. Field of the Invention

The present invention relates to a frequency stabilization circuit connected between a feeder circuit and an antenna element, and an antenna device and a communication terminal apparatus that include the frequency stabilization circuit.

2. Description of the Related Art

In recent years, mobile communication terminal apparatuses, such as portable phones, may require compatibility with communication systems, such as a GSM (Global System for Mobile Communications), a DCS (Digital Communication System), PCS (Personal Communication Services), and a UMTS (Universal Mobile Telecommunications System), as well as a GPS (Global Positioning System), a wireless LAN, Bluetooth (registered trademark), and other systems. Thus, antennas for such communication terminal apparatuses are required to cover a plurality of frequency bands of 800 MHz to 2.4 GHz.

Generally, the antennas have a frequency characteristic in the impedance of each antenna, so that when an impedance matching circuit is inserted between a feeder circuit and the antenna, matching with the feeder circuit cannot be achieved over a wide frequency band. For example, FIG. 1 shows an example that represents, on a Smith chart, an impedance trace of a simple whip antenna. The correspondence between each marker in FIG. 1 and frequency is as follows:

m10: 824 MHz
m11: 960 MHz
m12: 1.71 GHz
m13: 1.99 GHz

The impedance of 824 MHz and 960 MHz frequency bands (low band) is approximately 10Ω and the impedance of 1.71 GHz and 1.99 GHz frequency bands (high band) is approximately 28Ω.

Thus, when the frequency range to be handled becomes a wide frequency band, the impedance of the antenna significantly varies according to the frequency, making it impossible to match, in a single matching circuit, the impedance of the antenna with the impedance (50Ω) of the feeder circuit over a wide frequency band.

Accordingly, as an antenna to cover a plurality of frequency bands, a tunable antenna is known. The tunable antenna includes a matching circuit including a variable capacitance element, as disclosed in Japanese Patent Laid-Open Publication No. 2000-124728 and Japanese Patent Laid-Open Publication No. 2008-035065.

FIG. 2 is a view showing a major portion of a mobile receiver equipped with a matching unit as shown in Japanese Patent Laid-Open Publication No. 2008-035065. The matching unit 1 is connected to an antenna element ANT and a control signal source 6 so as to define an antenna matching circuit 100. The antenna matching circuit 100 receives a channel selection command SEL and changes the capacitance of the matching unit 1 so as to provide matching of the circuit impedance viewed from a receiving circuit 8 in accordance with the reception frequency of a corresponding channel. Then, the antenna matching circuit 100 outputs a radio signal received by the antenna ANT to the receiving circuit 8. The receiving circuit 8 amplifies the radio signal received from the antenna matching circuit 100 and outputs the signal as a reception signal RF.

However, the tunable antennas including a variable capacitance element, in general, require a circuit for controlling the variable capacitance element, that is, a switching circuit for switching the frequency band, such that the circuit configuration is complicated. In addition, since loss and distortion in the switching circuit are relatively large, a sufficient gain is difficult to obtain. Furthermore, since tuning requires a certain amount of time, the tunable antennas cannot be used for a communication frequency band that must be switched in an instant.

SUMMARY OF THE INVENTION

Preferred embodiments of the present invention provide an antenna device that achieves a frequency characteristic of a wide frequency band with a simple configuration, a frequency stabilization circuit for the antenna device, and a communication terminal apparatus including the antenna device.

A frequency stabilization circuit according to a preferred embodiment of the present invention includes a primary side circuit including a first reactance element that is connected to a feeder circuit, and a second reactance element that is connected in series to the first reactance element; a secondary side circuit including a third reactance element that is coupled to the first reactance element in an electromagnetic field, and a fourth reactance element that is connected in series between the second reactance element and the third reactance element and coupled to the second reactance element in the electromagnetic field; a first antenna connection portion that is connected to a connection point of the first reactance element and the second reactance element, or a connection point of the third reactance element and the fourth reactance element; and a second antenna connection portion that is connected to a connection point of the second reactance element and the fourth reactance element.

With this configuration, a single frequency stabilization circuit including the first to fourth reactance elements can match an antenna for wide frequency band with a feeder circuit. Therefore, an antenna device having a wide band frequency characteristic can be configured with a simple configuration.

The first antenna connection portion and the second antenna connection portion may preferably be terminals that are directly or indirectly connected to a shared antenna. With this configuration, a single shared antenna can be matched in two frequency bands.

The first antenna connection portion and the second antenna connection portion may preferably be terminals that are directly or indirectly connected to respective different antennas. With this configuration, even a single frequency stabilization circuit can use the first antenna and the second antenna that share a frequency band.

The first to fourth reactance elements may preferably be inductance elements that primarily include an inductance component. This easily increases the degree of coupling between the reactance elements, and insertion loss in the frequency stabilization circuit is reduced.

The first to fourth reactance elements may preferably be inductance elements that also include a capacitance component. This configuration easily increases the degree of coupling between the reactance elements, and insertion loss in the frequency stabilization circuit is reduced.

The inductance element described may preferably include a coiled conductor pattern. This configuration easily increases the degree of coupling between the inductance elements, and insertion loss in the frequency stabilization circuit is reduced.

The coiled conductor pattern may preferably be included in a laminate including a plurality of dielectric layers or magnetic layers that are laminated to one another. This structure enables a reduction in the overall size of frequency stabilization circuit and also reduces or prevents an unwanted coupling with an external circuit.

The first and second reactance elements may preferably have different inductance values, and the third and fourth reactance elements may preferably have different inductance values. Generally, since an antenna for a high band and an antenna for a low band have greatly different impedance levels, due to the difference between the above described inductance values, an impedance conversion ratio between the feeder circuit and the first antenna connection portion can be made appropriately different from an impedance conversion ratio between the feeder circuit and the second antenna connection portion.

The first antenna connection portion and the second antenna connection portion may preferably be connected to a frequency filter (either one from a high pass filter, a low pass filter, or a band pass filter.)

With this configuration, a signal of each frequency band is input into and output from the two antenna connection portions. This makes it possible to significantly reduce or prevent leakage of a signal in a different frequency band, so that matching is provided for each frequency band.

An antenna device according to a preferred embodiment of the present invention includes a frequency stabilization circuit including a primary side circuit that includes a first reactance element that is connected to a feeder circuit, and a second reactance element that is connected in series to the first reactance element; a secondary side circuit that includes a third reactance element that is coupled to the first reactance element in an electromagnetic field, and a fourth reactance element that is connected in series between the second reactance element and the third reactance element and coupled to the second reactance element in the electromagnetic field; a first antenna element that is connected to a connection point of the first reactance element and the second reactance element, or a connection point of the second reactance element and the fourth reactance element; and a second antenna element that is connected to a connection point of the third reactance element and the fourth reactance element.

With this configuration, a single frequency stabilization circuit including the first to fourth reactance elements match an antenna for wide frequency band with a feeder circuit. Therefore, the frequency stabilization circuit operates as an antenna device having a wide band frequency characteristic.

The first antenna element and the second antenna element may preferably share an antenna element. With this configuration, a single shared antenna can be matched in two frequency bands.

The first antenna element and the second antenna element may preferably be respective different antennas. With this configuration, even a single frequency stabilization circuit can use the first antenna and the second antenna that share a frequency band.

A first frequency filter may preferably be inserted between a connection point of the first reactance element and the second reactance element and the first antenna element, or between a connection point of the third reactance element and the fourth reactance element and the first antenna element; and a second frequency filter may preferably be inserted between the second antenna element and a connection point of the second reactance element and the fourth reactance element.

A communication terminal apparatus according to a preferred embodiment of the present invention includes an antenna device including a primary side circuit that includes a first reactance element that is connected to a feeding terminal, and a second reactance element that is connected in series to the first reactance element; a secondary side circuit that includes a third reactance element that is coupled to the first reactance element in an electromagnetic field, and a fourth reactance element that is connected in series between the second reactance element and the third reactance element and coupled to the second reactance element in the electromagnetic field; a first antenna element that is connected to a connection point of the first reactance element and the second reactance element, or a connection point of the third reactance element and the fourth reactance element; and a second antenna element that is connected to a connection point of the second reactance element and the fourth reactance element; and a communication circuit that is connected to the feeding terminal.

With this configuration, a single frequency stabilization circuit including the first to fourth reactance elements match an antenna for wide frequency band with a feeder circuit. Therefore, the frequency stabilization circuit operates as an antenna device for wide frequency band.

The first antenna element and the second antenna element may preferably share an antenna element. With this configuration, a single shared antenna can be matched in two frequency bands.

The first antenna element and the second antenna element may preferably be respective different antennas. With this configuration, even a single frequency stabilization circuit can use the first antenna and the second antenna that share a frequency band.

A first frequency filter may preferably be inserted between the first antenna element and a connection point of the first reactance element and the second reactance element, or between the first antenna element and a connection point of the third reactance element and the fourth reactance element; and a second frequency filter may preferably be inserted between the second antenna element and a connection point of the second reactance element and the fourth reactance element.

With the antenna devices according to various preferred embodiments of the present invention, impedance matching between a feeder circuit and an antenna element is achieved over a wider frequency band. In addition, since it is not necessary to use a variable capacitance element, loss and distortion are significantly reduced and prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A description will be provided of the operational effects of a frequency stabilization circuit according to preferred embodiments of the present invention and then the frequency stabilization circuit according to specific preferred embodiments of the present invention will be described.

Figure 3A:
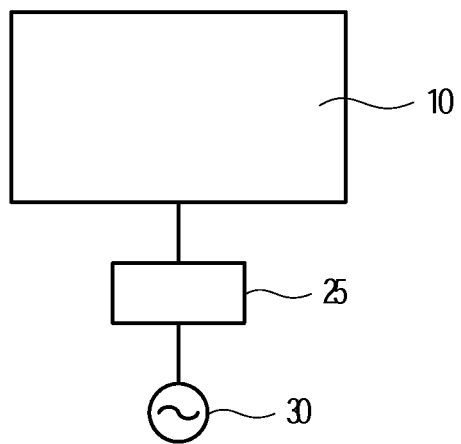
FIG. 3A is a schematic configuration view showing a frequency stabilization circuit according to a preferred embodiment of the present invention and an antenna device equipped with the frequency stabilization circuit.
Figure 3B:
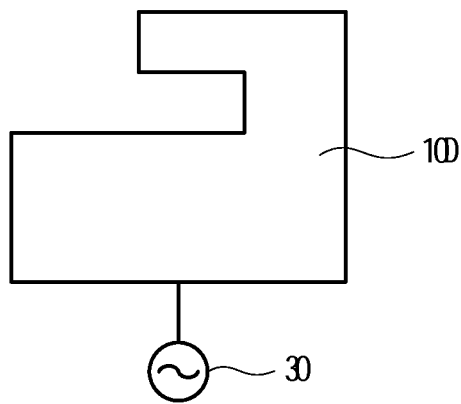
FIG. 3B is a schematic configuration view of an antenna device as a comparative example.

FIG. 3A is a schematic configuration view showing the frequency stabilization circuit according to preferred embodiments of the present invention, and an antenna device equipped with the frequency stabilization circuit. FIG. 3B is a schematic configuration view of an antenna device as a comparative example.

FIG. 3B shows a configuration of an antenna element 10D to which electric power is fed from a feeder circuit 30.

Conventional antenna design approaches had design restrictions such that the antenna element 10 had to be designed to be fit in an external appearance design since the external appearance of a product was previously determined. Non-limiting examples of factors to be considered when designing an antenna are:
(1) to enhance the radiation efficiency of the antenna to emit as much electric power as possible to space; and
(2) to carry out frequency regulation to achieve matching for inputting electric power to an antenna.

However, when an antenna is designed, because the antenna must be fit in a housing with a limited size and a shape of what the antenna is incorporated into must be considered, the radiation efficiency of the antenna and the frequency regulation are often in a trade-off relationship.

The frequency stabilization circuit 25 according to preferred embodiments of the present invention, as shown in FIG. 3A, includes a feed port and an antenna port, and the feed port is connected to a feeder circuit 30, and the antenna port is connected to an antenna element 10. The frequency stabilization circuit 25 and the antenna element 10 define an antenna device. Furthermore, the antenna device and a circuit including the feeder circuit 30 define a mobile communication terminal.

By using the frequency stabilization circuit 25 according to preferred embodiments of the present invention, the antenna element 10 has a simple shape in which capacitive coupling between the antenna elements and between the antenna element and the ground is reduced and is designed only to increase radiation efficiency, and frequency regulation is performed by the frequency stabilization circuit 25. Thus, the design of an antenna becomes extremely easy without being subjected to the above described trade-off relationship, and a development cycle can also be shortened significantly.

Figure 4:
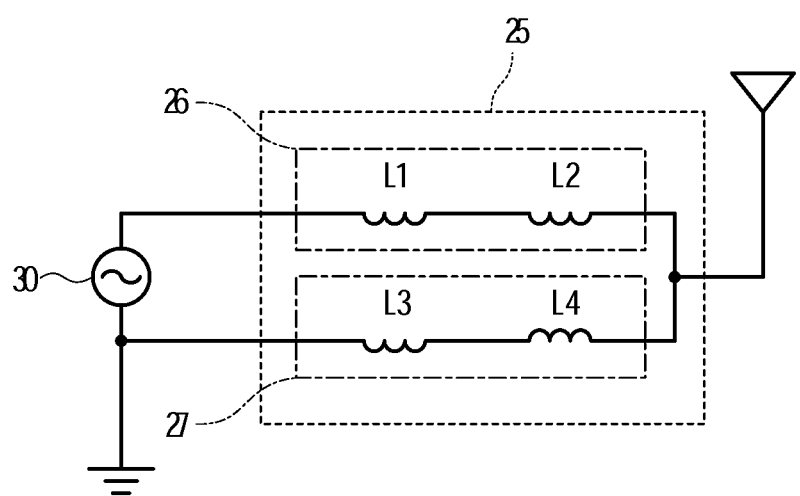
FIG. 4 is a circuit diagram of a basic configuration portion of the frequency stabilization circuit according to a preferred embodiment of the present invention.

FIG. 4 is a circuit diagram of a basic configuration portion of the frequency stabilization circuit 25 according to preferred embodiments of the present invention. The frequency stabilization circuit 25 includes a primary side circuit 26 that is connected to the feeder circuit 30, and a secondary side circuit 27 that is electromagnetically coupled to the primary side circuit 26. The primary side circuit 26 is a series circuit including a first coiled conductor L1 and a second coiled conductor L2, and the secondary side circuit 27 is a series circuit including a third coiled conductor L3 and a fourth coiled conductor L4. The primary side circuit 26 is connected between the antenna port and the feed port, and the secondary side circuit 27 is connected between the antenna port and the ground.

Figure 5:
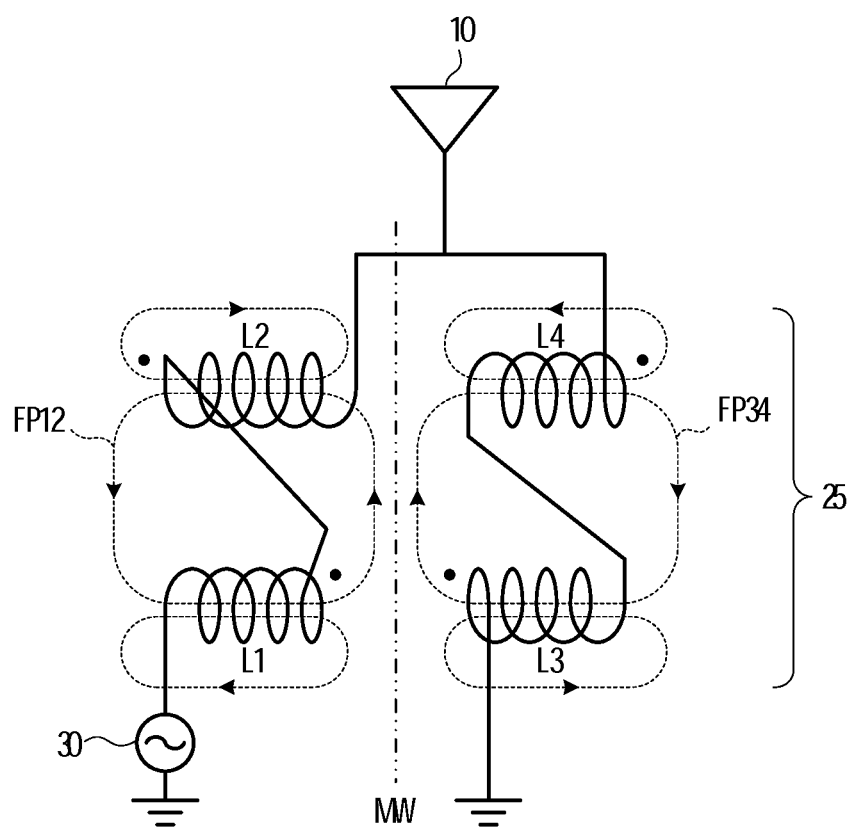
FIG. 5 is a diagram showing a relationship of magnetic couplings of four coiled conductors of the frequency stabilization circuit.

FIG. 5 is a diagram showing a relationship of magnetic couplings of the four coiled conductors L1 to L4 of the frequency stabilization circuit 25. As shown, the first coiled conductor L1 and the second coiled conductor L2 are wound so that a first closed magnetic circuit (a loop shown by magnetic flux FP12) is defined by the first coiled conductor L1 and the second coiled conductor L2, and the third coiled conductor L3 and the fourth coiled conductor L4 are wound so that a second closed magnetic circuit (a loop shown by magnetic flux FP34) is defined by the third coiled conductor L3 and the fourth coiled conductor L4. Thus, the four coiled conductors L1 to L4 are wound so that the magnetic flux FP12 that passes through the first closed magnetic circuit and the magnetic flux FP34 that passes through the second closed magnetic circuit are in directions opposite to each other. A straight line indicated by a long dashed double-short dashed line in FIG. 5 represents a magnetic wall MW at which the two magnetic fluxes FP12 and FP34 are not coupled to each other. In this manner, an equivalent magnetic wall MW is generated between the coiled conductors L1 and L3 and between the coiled conductors L2 and L4.

The frequency stabilization circuit 25 provides the following two primary functions.
(1) As the size of the antenna is reduced, the impedance of the antenna is reduced to, for example, about 3Ω to about 20Ω. The frequency stabilization circuit takes matching of a real part R of impedance by the transformation function of the frequency stabilization circuit.
(2) Since the antenna element primarily has an inductance characteristic, the frequency characteristic of impedance has an upward-sloping characteristic, and the frequency stabilization circuit operates as negative inductance, and the combination of the antenna element and frequency stabilization circuit moderates the slope of the frequency characteristic of the impedance of the antenna.

Figure 6:
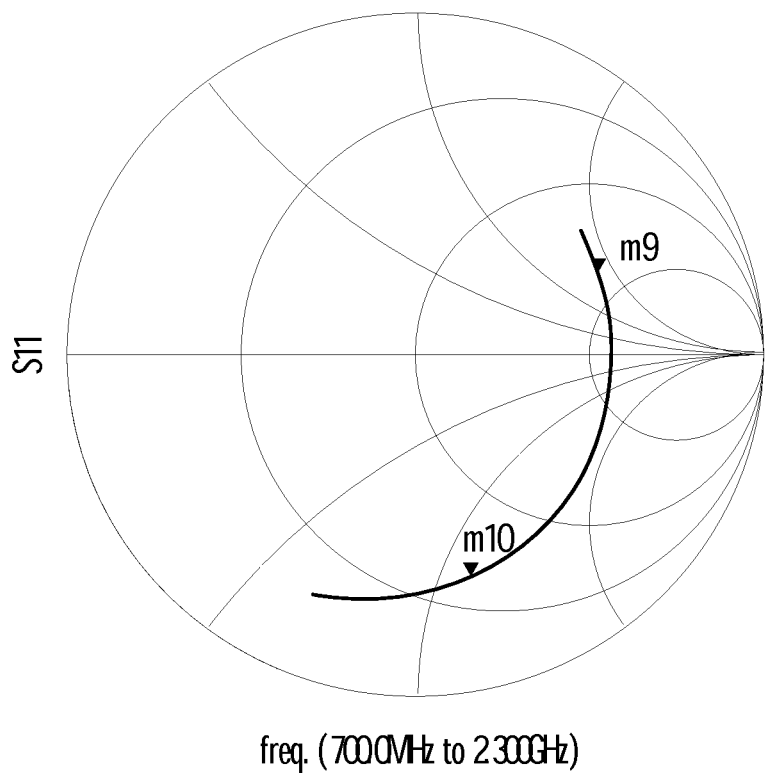
FIG. 6 is a view showing, on a Smith chart, a reflection property when a coupling coefficient of coiled conductors among the coiled conductors is set to a predetermined value and a feeding port is viewed from a feeder circuit.

A description will now be provided of the frequency stabilization circuit operating as negative inductance. FIG. 6 is a view showing, on a Smith chart, a reflection property (s11) when a coupling coefficient k of the coiled conductors among the coiled conductors L1 to L4 is set to a predetermined value and a feeding port is viewed from a feeder circuit.
Each coupling coefficient k is as follows:

$$L1<-->L2\ k \approx -0.3$$

$$L3<-->L4\ k \approx -0.3$$

$$L1<-->L3\ k \approx -0.8$$

$$L2<-->L4\ k \approx -0.8$$

In this manner, L1 and L3, and L2 and L4 are strongly coupled (i.e., as strong as k≈−0.8) and L1 and L2, and L3 and L4 are weakly coupled (i.e., as weak as k≈−0.3), so that a value of mutual inductance M generated by the coupling is maintained large while the RMS value of L1, L2, L3, and L4 is reduced. Therefore, the coupling coefficient k is equivalently not less than one, and the impedance of the frequency stabilization circuit will be viewed as a negative inductance. That is to say, it becomes possible to achieve a metamaterial structure.

It is to be noted that the coupling between L1 and L2 and the coupling between L3 and L4 (the coupling between laterally arranged coiled conductors) are magnetic field couplings in which respective inductance values are reduced, and the coupling between L1 and L3 and the coupling between L2 and L4 (the coupling between vertically arranged coiled conductors) are not affected by the couplings between the laterally arranged coiled conductors, so that it is assumed that such a new effect is produced.

In FIG. 6, the marker m9 is the input impedance (S(1, 1)=0.358+j0.063) in the frequency band of about 820 MHz, and the marker m10 is the input impedance (S(1, 1)=0.382−j0.059) in the frequency band of 1.99 GHz. Thus, the input impedance becomes inductive in the low frequency band and becomes capacitive in the high frequency band, and a negative inductance of which a real number component (a resistance component) continuously varies is obtained.

Figure 7:
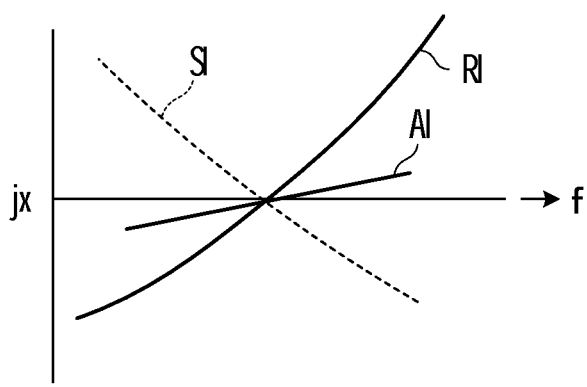
FIG. 7 is a view showing impedance matching between an antenna element and a feeder circuit by the frequency stabilization circuit having a negative inductance characteristic.

FIG. 7 is a view showing impedance matching between an antenna element and a feeder circuit by the frequency stabilization circuit having the negative inductance characteristic. In FIG. 7, the horizontal axis represents frequency f and the vertical axis represents reactance jx. The antenna element itself includes inductance and has capacitance between the antenna element and the ground. Therefore, impedance jxa of the antenna element is represented by jxa=ωL−1/ωC. A curve RI in FIG. 7 represents the impedance jxa of the antenna element. The resonance frequency of the antenna element is shown when jxa=0. On the other hand, the impedance of the frequency stabilization circuit is a negative inductance, and is represented by a downward-sloping characteristic as is represented by a curved line (or a straight line) SI. Thus, the impedance (the impedance viewed from the feed port) of the antenna device including the frequency stabilization circuit and the antenna element becomes a frequency characteristic with a small slope as shown by a curved line (or a straight line) AI.

Referring to FIG. 7, if the real portion of the impedance of the antenna element at a point in which the frequency is deviated from the resonance frequency is represented by R, and a frequency satisfying a relationship of jx=R is set to f1, the frequency f1 is a (3 dB cutoff) frequency in which the half of the input electric power is reflected and the other half is radiated. Accordingly, when −R is assumed and a frequency at which jx=−R is set to f2, the frequency width of frequencies f2 to f1 can be defined as the bandwidth (full width at half maximum) of the antenna.

As the slope of the impedance of the antenna device including the frequency stabilization circuit and the antenna element is moderated, a frequency at which jx=R is higher than the above described f1, and a frequency at which jx=−R is lower than the above described f2. Therefore, the bandwidth (3 dB cutoff frequency band) of the antenna becomes wider. That is to say, impedance matching can be achieved over a wide frequency band. This is an advantageous effect resulting from the negative inductance.

First Preferred Embodiment

Subsequently, the configurations of a frequency stabilization circuit and an antenna device according to a first preferred embodiment of the present invention will be described with reference to FIG. 8 and FIG. 9.

Figure 8:
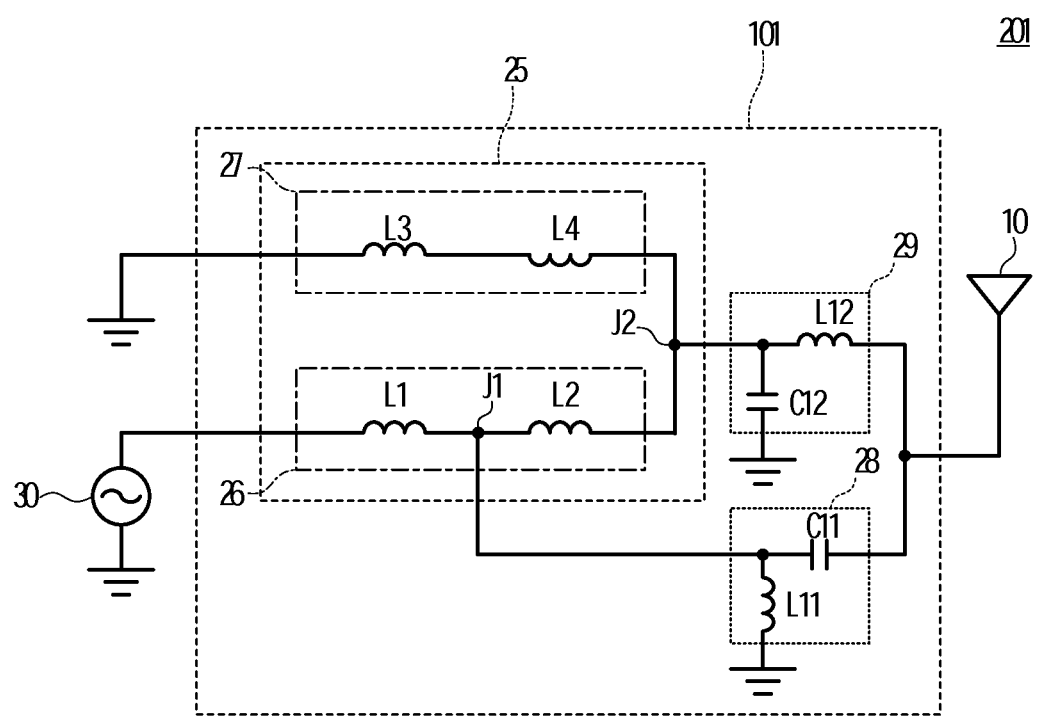
FIG. 8 is a circuit diagram of a frequency stabilization circuit and an antenna device according to a first preferred embodiment of the present invention.

FIG. 8 is a circuit diagram of the frequency stabilization circuit and the antenna device according to the first preferred embodiment. The frequency stabilization circuit 25 includes a primary side circuit 26 that is connected to a feeder circuit 30, and a secondary side circuit 27 that is electromagnetically coupled to the primary side circuit 26. The primary side circuit 26 is a series circuit including a first coiled conductor L1 and a second coiled conductor L2, and the secondary side circuit 27 is a series circuit including a third coiled conductor L3 and a fourth coiled conductor L4. One end of the first coiled conductor L1 is connected to the feeder circuit 30, and one end of the third coiled conductor L3 is grounded. The second coiled conductor L2 and the fourth coiled conductor L4 are connected at a connection point, and the primary side circuit 26 is connected between the connection point and the feeder circuit 30. The secondary side circuit 27 is connected between the connection point of the second coiled conductor L2 and the fourth coiled conductor L4, and the ground.

The coiled conductors L1 to L4 correspond to first to fourth reactance elements, respectively. A first antenna connection portion J1 is between the coiled conductor L1 and the coiled conductor L2, and a second antenna connection portion J2 is between the coiled conductor L2 and the coiled conductor L4.

A high pass filter 28 is disposed between the first antenna connection portion J1 and an antenna element 10. In addition, a low pass filter 29 is disposed between the second antenna connection portion J2 and the antenna element 10. That is, in the first preferred embodiment, the antenna element 10 is indirectly connected to the first antenna connection portion J1 and the second antenna connection portion J2.

The high pass filter 28 includes a capacitor C11 connected in series to the signal line, and an inductor L11 connected to a shunt. The low pass filter 29 includes an inductor L12 connected in series to the signal line, and a capacitor C12 connected to another shunt.

The above described frequency stabilization circuit 25 is as shown in FIG. 4. The frequency stabilization circuit 25 and the frequency filters 28 and 29 define a frequency stabilization circuit 101 including a filter. Then, the frequency stabilization circuit 101 including a filter and the antenna element 10 define an antenna device 201.

The inductances of the coiled conductors L1, L2, L3, and L4 as shown in FIG. 8 are represented by the same signs L1, L2, L3, and L4. In this case, the inductances are preferably as follows:

L1=20 [nH]
L2=20 [nH]
L3=5 [nH]
L4=5 [nH]

Thus, when the feeder circuit 30 is an input portion and the first antenna connection portion J1 is an output portion, the transformation ratio by the coiled conductors L1 to L4 is:

$$\frac{(L2 + L3 + L4)}{(L1 + L2 + L3 + L4)} = \frac{(20 + 5 + 5)}{(20 + 20 + 5 + 5)} = \frac{3}{5}.$$

Figure 1:
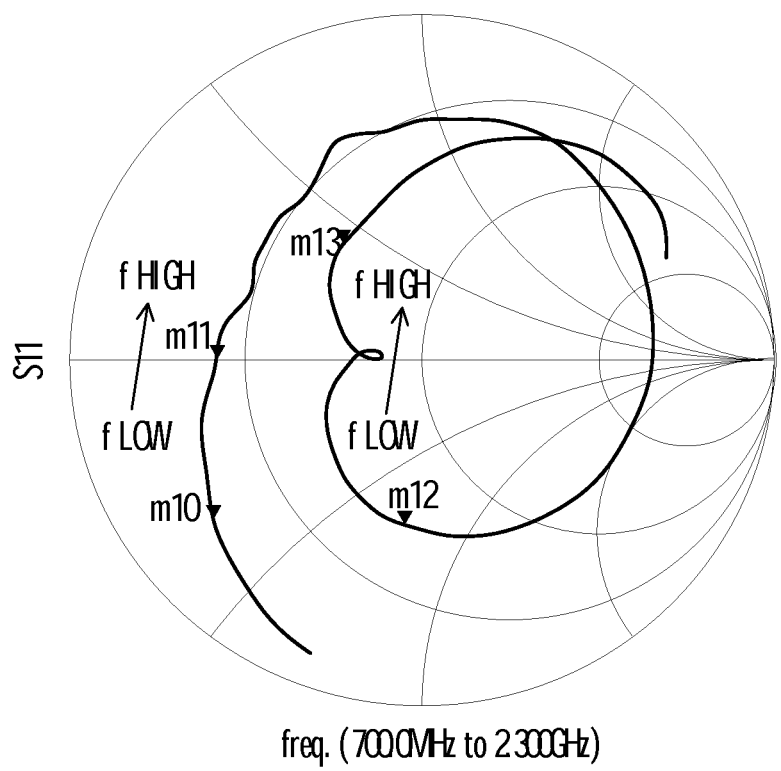
FIG. 1 is a view showing, on a Smith chart, an impedance trace of an impedance of a known simple whip antenna.
Figure 2:
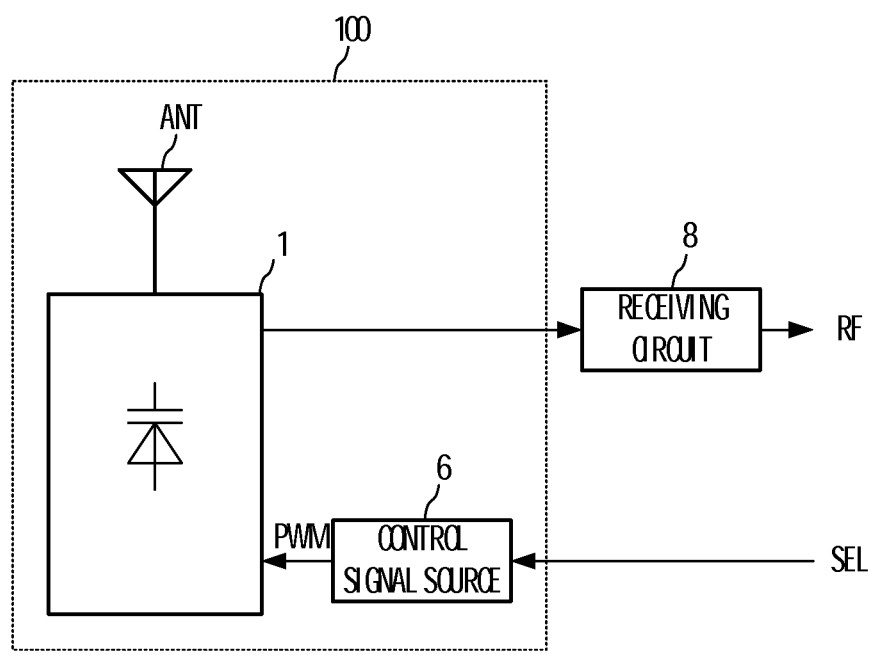
FIG. 2 is a view showing a major portion of a mobile receiver equipped with a matching unit as shown in Japanese Patent Laid-Open Publication No. 2008-035065.

In a case in which the antenna element 10 has the characteristics as showed in FIG. 1, the impedance in the high band is about 28Ω and the impedance conversion by the transformation ratio is 50×(3/5)=30Ω≈28Ω, which matches the impedance.

Alternatively, when the feeder circuit 30 is an input portion and the second antenna connection portion J2 is an output portion, the transformation ratio by the coiled conductors L1 to L4 is:

$$\frac{(L3 + L4)}{(L1 + L2 + L3 + L4)} = \frac{(5 + 5)}{(20 + 20 + 5 + 5)} = \frac{1}{5}.$$

In the case in which the antenna element 10 has the characteristics as showed in FIG. 1, the impedance in the low band preferably is about 10Ω and the impedance conversion by the transformation ratio preferably is 50×(1/5)=10Ω, for example, which matches the impedance.

The high pass filter 28 connected to the first antenna connection portion J1 passes a signal of the high band (e.g., 2 GHz frequency band), and prevents a signal of the low band (e.g., 900 MHz frequency band). Therefore, the signal of the high band is input into and output from in the first antenna connection portion J1, and the signal of the low band is input into and output from in the second antenna connection portion J2. This prevents leakage of a signal of the high band and a signal of the low band, so that matching is provided for each of the high band and low band.

Figure 9:
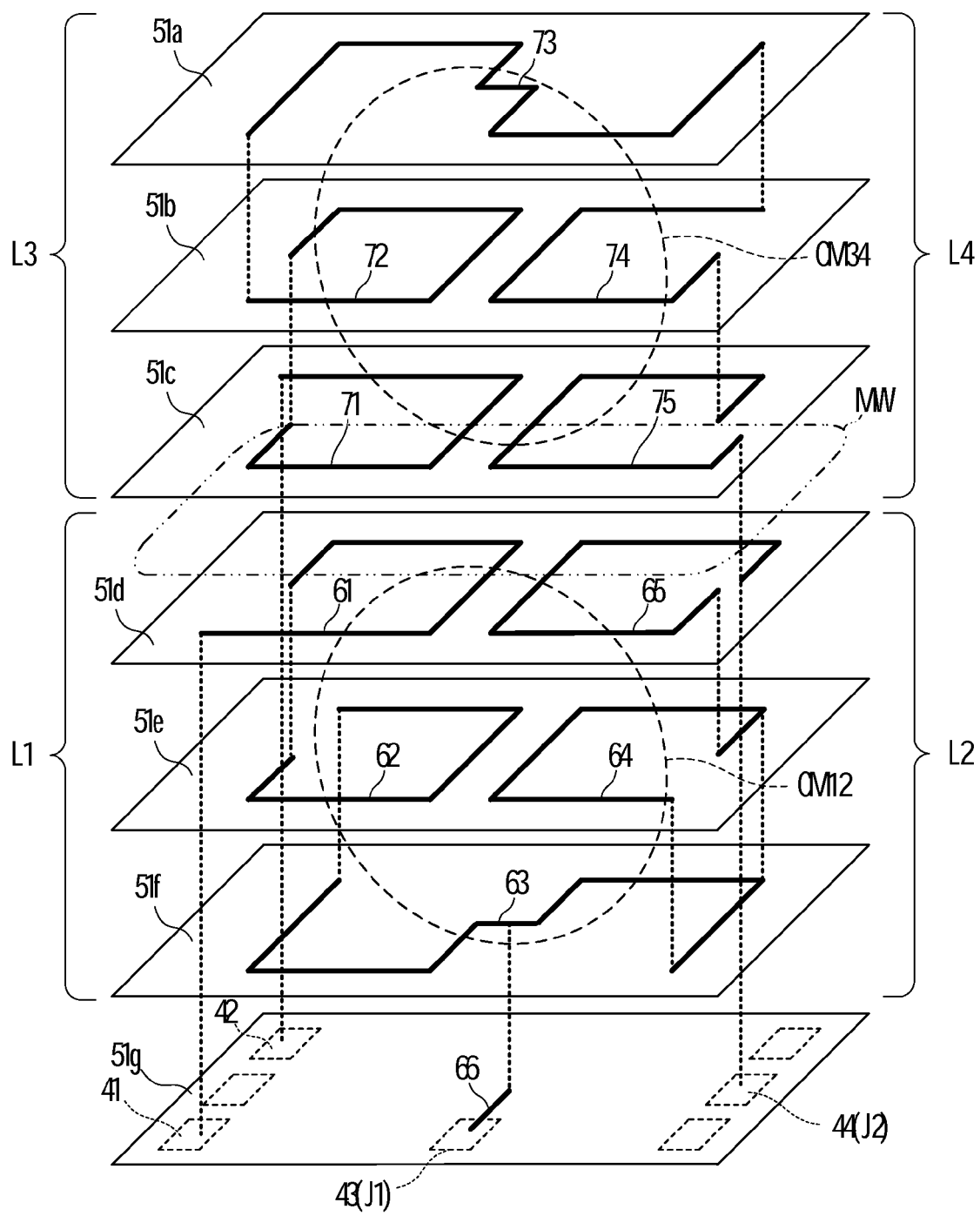
FIG. 9 is a view showing an example of a conductor pattern of each layer when the frequency stabilization circuit 25 according to the first preferred embodiment of the present invention is configured in a multilayer substrate.

FIG. 9 is a view showing an example of a conductor pattern of each layer when the frequency stabilization circuit 25 according to the first preferred embodiment is configured in a multilayer substrate made of a magnetic material or a dielectric material, for example. Each layer may preferably be made of a magnetic sheet. While the conductor pattern of each layer, when viewed in the direction shown in FIG. 9, is provided at the reverse side of the magnetic sheet, each conductor pattern is indicated by a solid line. Also, each linear conductor pattern has a predetermined line width, and is indicated by a simple solid line in the present preferred embodiment.

In the area shown in FIG. 9, a conductor pattern 73 is provided on the reverse side of a first layer 51a, conductor patterns 72 and 74 are provided on the reverse side of a second layer 51b, and conductor patterns 71 and 75 are provided on the reverse side of a third layer 51c. Conductor patterns 61 and 65 are provided on the reverse side of a fourth layer 51d, conductor patterns 62 and 64 are provided on the reverse side of a fifth layer 51e, and a conductor pattern 63 is provided on the reverse side of a sixth layer 51f. A conductor pattern 66, a feeding terminal 41, a ground terminal 42, a first antenna connection terminal 43, and a second antenna connection terminal 44 are provided on the reverse side of a seventh layer 51g. Dotted lines extending vertically in FIG. 9 represent via conductors that provide inter-layer connections between the corresponding conductor patterns. While these via conductors are, in practice, cylindrical electrodes having predetermined diameters, the via conductors in this preferred embodiment are indicated by simple dotted lines.

As shown in FIG. 9, the left half of the conductor pattern 63 and the conductor patterns 61 and 62 define the first coiled conductor L1. In a similar manner, the right half of the conductor pattern 63 and the conductor patterns 64 and 65 define the second coiled conductor L2. Furthermore, the left half of the conductor pattern 73 and the conductor patterns 71 and 72 define the third coiled conductor L3. The right half of the conductor pattern 73 and the conductor patterns 74 and 75 define the fourth coiled conductor L4. The winding axes of the respective coiled conductors L1 to L4 are oriented in the stacking direction of the multiplayer substrate. The winding axes of the first coiled conductor L1 and the second coiled conductor L2 are juxtaposed so that the respective winding axes have a different relationship. Similarly, the third coiled conductor L3 and the fourth coiled conductor L4 are juxtaposed so that the respective winding axes have a different relationship. The winding area of the first coiled conductor L1 and the winding area of the third coiled conductor L3 overlap each other at least partially in a plan view and the winding area of the second coiled conductor L2 and the winding area of the fourth coiled conductor L4 overlap each other at least partially in a plan view. In the present preferred embodiment, the coiled conductors preferably substantially completely overlap each other. In the manner described above, the four coiled conductors include the conductor patterns having an 8-shaped structure.

It should be noted that each layer may be made of a dielectric sheet. However, the use of a magnetic sheet having a high relative permeability makes it possible to further increase the coupling coefficient between the coiled conductors.

In addition, a loop broken line as shown in FIG. 9 represents a closed magnetic circuit. A closed magnetic circuit CM12 interlinks with the coiled conductors L1 and L2. A closed magnetic circuit CM34 also interlinks with the coiled conductors L3 and L4. Thus, the first coiled conductor L1 and the second coiled conductor L2 define the first closed magnetic circuit CM12, and the third coiled conductor L3 and the fourth coiled conductor L4 define the second closed magnetic circuit CM34. A plane denoted by a long dashed double-short dashed line in FIG. 9 represents a magnetic wall MW that is equivalently generated since the coiled conductors L1 and L3 are coupled to generate a magnetic flux in directions opposite to each other between the corresponding two closed magnetic circuits and the coiled conductors L2 and L4 are coupled to generate a magnetic flux in directions opposite to each other between the corresponding two closed magnetic circuits. In other words, the magnetic wall MW closes the magnetic flux of the closed magnetic circuit defined by the coiled conductors L1 and L2 and the magnetic flux of the closed magnetic circuit defined by the coiled conductors L3 and L4.

Additionally, a capacitance is generated in each of adjacent coiled conductors, and the coiled conductors are also coupled by the capacitance.

In this manner, a frequency stabilization circuit is provided and impedance conversion can be performed on each of a high band antenna and a low band antenna.

Second Preferred Embodiment

Figure 10:
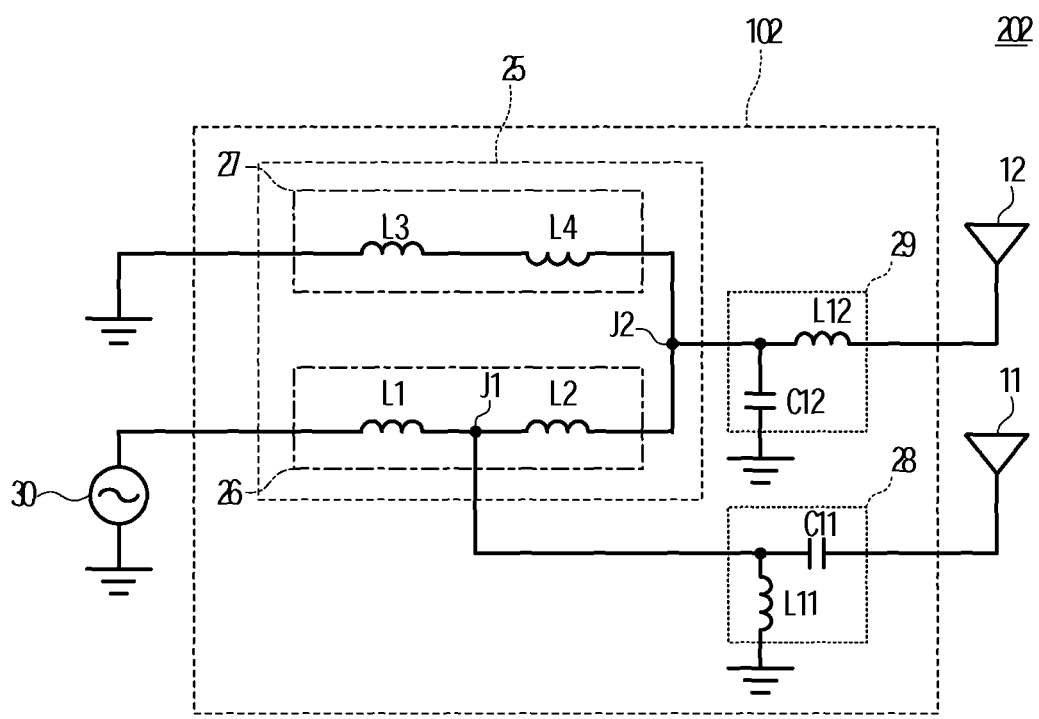
FIG. 10 is a circuit diagram of a frequency stabilization circuit and an antenna device according to a second preferred embodiment of the present invention.

FIG. 10 is a circuit diagram of a frequency stabilization circuit and an antenna device according to a second preferred embodiment of the present invention. The frequency stabilization circuit 25 is preferably the same or substantially the same as that shown in FIG. 8 in the first preferred embodiment. The configurations of the high pass filter 28 and the low pass filter 29 are preferably the same or substantially the same as those as shown in FIG. 8 in the first preferred embodiment. While a single antenna element 10 is provided in the first preferred embodiment, both a first antenna element 11 for high band (2 GHz frequency band, 1710 to 2690 MHz, for example) and a second low band antenna (900 MHz frequency band, 704 to 960 MHz, for example) are included in the second preferred embodiment shown in FIG. 10. The frequency stabilization circuit 25 and the frequency filters 28 and 29 define a frequency stabilization circuit 102 including a filter. Then, the frequency stabilization circuit 102 including a filter, the first antenna element 11, and the second antenna element 12 define an antenna device 202.

For example, the first antenna element 11 for high band is preferably defined by a radiation electrode pattern provided in a ground non-formation region of a substrate, and the second antenna element 12 for low band is preferably a chip antenna mounted on a ground electrode of the substrate. In this manner, according to a frequency band, an antenna element may be individually provided. As such, it becomes easy to optimize the characteristics of each antenna element.

It is to be noted that even when a single antenna is not shared, by including the high pass filter 28 and the low pass filter 29, a signal of the high band is input into and output from in the first antenna connection portion J1, a signal of the low band is input into and output from in the second antenna connection portion J2, so that leakage of a signal in the frequency stabilization circuit 25 is significantly reduced or prevented.

It should be noted that in a mobile communication terminal device, due to the size limitation, the impedance of the low band antenna is usually smaller than the impedance of the high band antenna. In a case of an antenna having a simple shape (i.e., a flat plate shape and a planar shape, for example) and excellent radiation efficiency, whereas the impedance of the high band antenna is approximately 10Ω to approximately 20Ω, the impedance of the low band antenna is approximately 5Ω to approximately 10Ω.

On the other hand, since the impedance of the feeder circuit is usually about 50Ω, the impedance conversion ratio of the low band antenna needs to be increased, as compared to the impedance conversion ratio of the high band antenna.

In the frequency stabilization circuit 102 of the second preferred embodiment as shown in FIG. 10, since the transformation ratio (the impedance conversion ratio) in the high band is:

$(L2+L3+L4)/(L1+L2+L3+L4)$, and the transformation ratio (the impedance conversion ratio) in the low band is:

$(L3+L4)/(L1+L2+L3+L4)$, compared to the impedance conversion ratio applied to the high band antenna, the impedance conversion ratio applied to the low band antenna is increased.

In this manner, with the frequency stabilization circuit according to the present preferred embodiment, even if a plurality of antennas are provided and the characteristic impedance of each antenna differs, the impedance conversion can be performed using an impedance conversion ratio corresponding to the characteristic impedance of each antenna.

Third Preferred Embodiment

Figure 11:
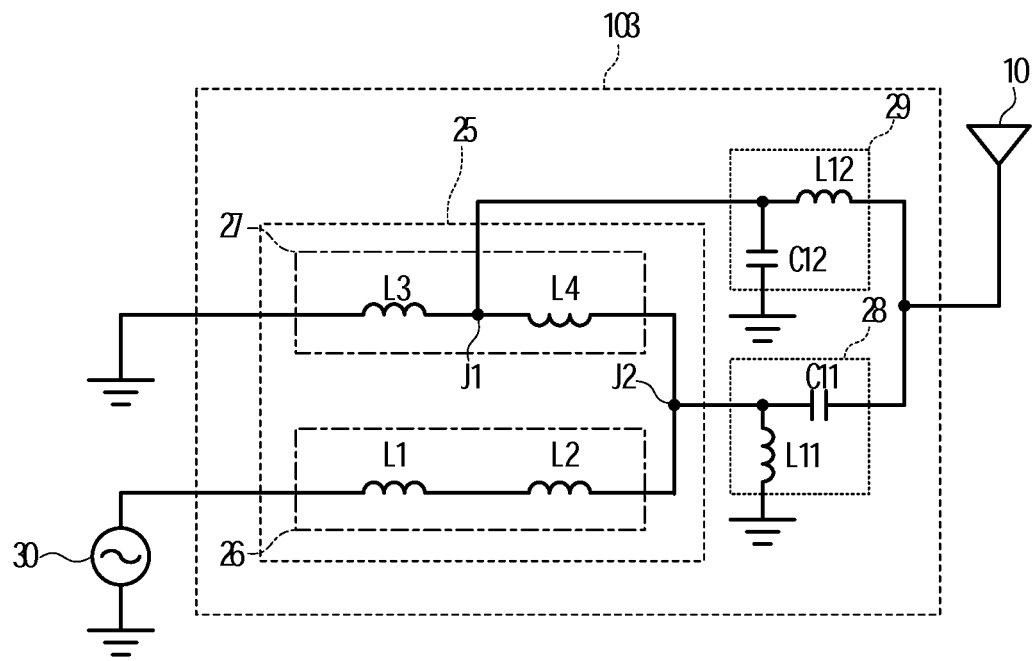
FIG. 11 is a circuit diagram of a frequency stabilization circuit and an antenna device according to a third preferred embodiment of the present invention.

FIG. 11 is a circuit diagram of a frequency stabilization circuit and an antenna device according to a third preferred embodiment of the present invention. The frequency stabilization circuit 25 is preferably the same or substantially the same as that shown in FIG. 8 in the first preferred embodiment. The configurations of the high pass filter 28 and the low pass filter 29 are also preferably the same or substantially the same as those as shown in FIG. 8 in the first preferred embodiment. Whereas, in the first preferred embodiment shown in FIG. 8, a connection point between the first coiled conductor L1 and the second coiled conductor L2 preferably is the first antenna connection portion J1, and a connection point between the second coiled conductor L2 and the fourth coiled conductor L4 preferably is the second antenna connection portion J2, in the third preferred embodiment shown in FIG. 11, a connection point between the third coiled conductor L3 and the fourth coiled conductor L4 preferably is a first antenna connection portion J1, and a connection point between the second coiled conductor L2 and the fourth coiled conductor L4 is the second antenna connection portion J2. Furthermore, while the high pass filter is connected to the first antenna connection portion J1 and the low pass filter is connected to the second antenna connection portion J2 in the first preferred embodiment shown in FIG. 8, the low pass filter is connected to the first antenna connection portion J1, and the high pass filter is connected to the second antenna connection portion J2 in the third preferred embodiment shown in FIG. 11. The frequency stabilization circuit 25 and the frequency filters 28 and 29 define a frequency stabilization circuit 103 including a filter. Then, the frequency stabilization circuit 103 including a filter and the antenna element 10 define an antenna device 203.

In the third preferred embodiment shown in FIG. 11, when the feeder circuit 30 is an input portion and the first antenna connection portion J1 is an output portion, the transformation ratio by the coiled conductors L1 to L4 is:

$L3/(L1+L2+L3+L4)$.

In addition, when the feeder circuit 30 is an input portion and the second antenna connection portion J2 is an output portion, the transformation ratio by the coiled conductors L1 to L4 is:

$(L3+L4)/(L1+L2+L3+L4)$.

In this manner, the antenna connection portion having a larger impedance conversion ratio may preferably be set as a connection point between the third coiled conductor L3 and the fourth coiled conductor L4, and the antenna connection portion having a smaller impedance conversion ratio may also preferably be set as a connection point between the second coiled conductor L2 and the fourth coiled conductor L4.

Fourth Preferred Embodiment

Figure 12:
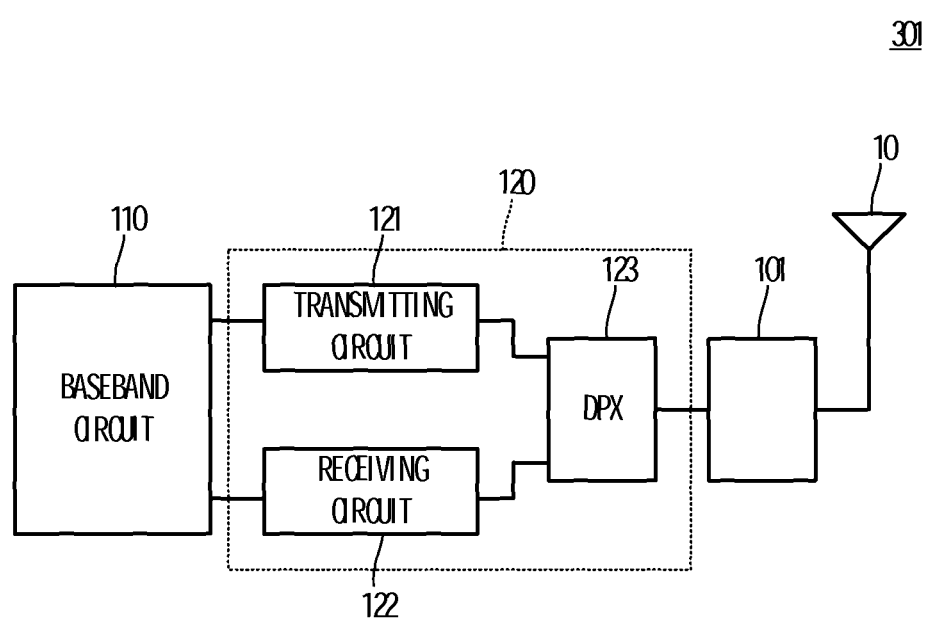
FIG. 12 is a block diagram of a communication terminal apparatus 301 according to a fourth preferred embodiment of the present invention.

FIG. 12 is a block diagram of a communication terminal apparatus 301 according to a fourth preferred embodiment of the present invention. The communication terminal apparatus 301 includes a baseband circuit 110, a communication circuit 120, a frequency stabilization circuit 101 including a filter, and an antenna element 10. The frequency stabilization circuit 101 including a filter and the antenna element 10 are preferably as described in the first preferred embodiment. The communication circuit 120 includes a transmitting circuit 121, a receiving circuit 122, and a duplexer 123.

In place of the frequency stabilization circuit 101 including a filter and the antenna element 10 that are described in the first preferred embodiment, the frequency stabilization circuit including a filter and the antenna element that are described in the second preferred embodiment or the third preferred embodiment may also be used.

In each of the above described preferred embodiments of the present invention, whereas the antenna connection portion having a larger impedance conversion ratio preferably is set as an antenna connection portion for a low band and the antenna connection portion having a smaller impedance conversion ratio preferably is set as a connection point for high band, in a case in which the antenna elements of the low band antenna and the high band antenna that have an inverse relationship between high impedance and low impedance are connected, the antenna connection portion having a larger impedance conversion ratio may preferably be set as a connection portion for low band, and the antenna connection portion having a smaller impedance conversion ratio may preferably be set as a connection portion for high band.

Moreover, whereas each of the above described preferred embodiments has exemplified the high pass filter and the low pass filter as a frequency filter, a band pass filter may also be used. Furthermore, in a case in which two antenna elements corresponding to a different frequency band are used as in the second preferred embodiment, the antenna element may be directly connected to the antenna connection portion, not via the filters.

In addition, whereas each of the above described preferred embodiments has exemplified the first coiled conductor L1 and the second coiled conductor L2 as preferably having the same inductance, the third coiled conductor L3 and the fourth coiled conductor L4 as preferably having the same inductance, the first coiled conductor L1 and the second coiled conductor L2 may have different inductance, and the third coiled conductor L3 and the fourth coiled conductor L4 may preferably have different inductance. By the difference between the above described inductance values, an impedance conversion ratio between the feeder circuit and the first antenna connection portion can be appropriately set to be different from an impedance conversion ratio between the feeder circuit and the second antenna connection portion.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A frequency stabilization circuit comprising:
   a primary side circuit including:
      a first reactance element connected to a feeder circuit; and
      a second reactance element connected in series to the first reactance element;
   a secondary side circuit including:
      a third reactance element electromagnetically coupled to the first reactance element; and
      a fourth reactance element connected in series between the second reactance element and the third reactance element and electromagnetically coupled to the second reactance element;
   a first antenna connection portion connected to a connection point of the first reactance element and the second reactance element, or to a connection point of the third reactance element and the fourth reactance element; and
   a second antenna connection portion connected to a connection point of the second reactance element and the fourth reactance element.

2. The frequency stabilization circuit according to claim 1, wherein the first antenna connection portion and the second antenna connection portion are terminals that are directly or indirectly connected to a shared antenna.

3. The frequency stabilization circuit according to claim 1, wherein the first antenna connection portion and the second antenna connection portion are terminals that are directly or indirectly connected to respective different antennas.

4. The frequency stabilization circuit according to claim 1, wherein the first, second, third, and fourth reactance elements are inductance elements that each primarily include an inductance component.

5. The frequency stabilization circuit according to claim 4, wherein the first, second, third, and fourth reactance elements are inductance elements that each also include a capacitance component.

6. The frequency stabilization circuit according to claim 5, wherein each of the inductance elements includes a coiled conductor pattern.

7. The frequency stabilization circuit according to claim 6, wherein the coiled conductor pattern is included in a laminate including a plurality of dielectric layers or magnetic layers that are laminated to one another.

8. The frequency stabilization circuit according to claim 1, the first reactance element and the second reactance element have different inductance values, and the third reactance element and the fourth reactance element have different inductance values.

9. The frequency stabilization circuit according to claim 1, further comprising a frequency filter connected to the first antenna connection portion and the second antenna connection portion.

10. An antenna device comprising:
    a frequency stabilization circuit including:
       a primary side circuit that includes:
          a first reactance element connected to a feeder circuit; and
          a second reactance element connected in series to the first reactance element;
       a secondary side circuit that includes:
          a third reactance element electromagnetically coupled to the first reactance element; and
          a fourth reactance element connected in series between the second reactance element and the third reactance element and electromagnetically coupled to the second reactance element;
    a first antenna element connected to a connection point of the first reactance element and the second reactance element, or to a connection point of the second reactance element and the fourth reactance element; and
    a second antenna element connected to a connection point of the third reactance element and the fourth reactance element.

11. The antenna device according to claim 10, wherein the first antenna element and the second antenna element are defined by a common antenna element.

12. The antenna device according to claim 10, wherein the first antenna element and the second antenna element are defined by different antenna elements.

13. The antenna device according to claim 10, further comprising:
    a first frequency filter disposed between a connection point of the first reactance element and the second reactance element and the first antenna element, or between a connection point of the third reactance element and the fourth reactance element and the first antenna element; and a second frequency filter disposed between the second antenna element and a connection point of the second reactance element and the fourth reactance element.

14. The antenna device according to claim 10, wherein the first, second, third, and fourth reactance elements are inductance elements that each primarily include an inductance component.

15. A communication terminal apparatus comprising:
   an antenna device including:
      a primary side circuit that includes:
         a first reactance element connected to a feeding terminal; and
         a second reactance element connected in series to the first reactance element;
      a secondary side circuit that includes:
         a third reactance element electromagnetically coupled to the first reactance element, and
         a fourth reactance element connected in series between the second reactance element and the third reactance element and electromagnetically coupled to the second reactance element;
      a first antenna element connected to a connection point of the first reactance element and the second reactance element, or to a connection point of the third reactance element and the fourth reactance element; and
      a second antenna element connected to a connection point of the second reactance element and the fourth reactance element; and
   a communication circuit connected to the feeding terminal.

16. The communication terminal apparatus according to claim 15, wherein the first antenna element and the second antenna element are defined by a common antenna element.

17. The communication terminal apparatus according to claim 15, wherein the first antenna element and the second antenna element are defined by different antenna elements.

18. The communication terminal apparatus according to claim 15, further comprising:
   a first frequency filter disposed between a connection point of the first reactance element and the second reactance element and the first antenna element, or between a connection point of the third reactance element and the fourth reactance element and the first antenna element; and
   a second frequency filter disposed between the second antenna element and a connection point of the second reactance element and the fourth reactance element.

19. The communication terminal apparatus according to claim 15, wherein the first, second, third, and fourth reactance elements are inductance elements that each primarily include an inductance component.

* * * * *